(12) United States Patent
Tachibana et al.

(10) Patent No.: US 9,324,540 B2
(45) Date of Patent: Apr. 26, 2016

(54) CHARGED PARTICLE BEAM DEVICE

(71) Applicant: Hitachi High-Technologies Corporation, Tokyo (JP)

(72) Inventors: Ichiro Tachibana, Tokyo (JP); Naomasa Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/407,117

(22) PCT Filed: Apr. 12, 2013

(86) PCT No.: PCT/JP2013/061010
§ 371 (c)(1),
(2) Date: Dec. 11, 2014

(87) PCT Pub. No.: WO2013/187115
PCT Pub. Date: Dec. 19, 2013

(65) Prior Publication Data
US 2015/0136979 A1    May 21, 2015

(30) Foreign Application Priority Data

Jun. 15, 2012   (JP) .................. 2012-135297

(51) Int. Cl.
*H01J 37/26* (2006.01)
*G21K 5/04* (2006.01)
(Continued)

(52) U.S. Cl.
CPC ............. *H01J 37/21* (2013.01); *H01J 37/10* (2013.01); *H01J 37/147* (2013.01); *H01J 37/263* (2013.01);
(Continued)

(58) Field of Classification Search
USPC ............. 250/396 R, 397, 305, 306, 307, 309, 250/310, 311, 492.1, 492.2, 492.21, 492.22, 250/492.23, 492.3
See application file for complete search history.

(56) References Cited

U.S. PATENT DOCUMENTS

| | | | |
|---|---|---|---|
| 6,667,476 B2 | 12/2003 | Todokoro et al. | |
| 2003/0042417 A1 | 3/2003 | Nakasuji et al. | |

(Continued)

FOREIGN PATENT DOCUMENTS

| | | |
|---|---|---|
| JP | 11-317189 A | 11/1999 |
| JP | 2003-151484 A | 5/2003 |

(Continued)

OTHER PUBLICATIONS

International Search Report (PCT/ISA/210) dated Jun. 4, 2013, with English translation (eight (8) pages).

*Primary Examiner* — Nicole Ippolito
(74) *Attorney, Agent, or Firm* — Crowell & Moring LLP

(57) ABSTRACT

When a signal electron is detected by energy selection by combining and controlling retarding and boosting for observation of a deep hole, etc., the only way for focus adjustment is to use a change in magnetic field of an objective lens. However, since responsiveness of the change in magnetic field is poor, throughput reduces. A charged particle beam device includes: an electron source configured to generate a primary electron beam; an objective lens configured to focus the primary electron beam; a deflector configured to deflect the primary electron beam; a detector configured to detect a secondary electron or a reflection electron generated from a sample by irradiation of the primary electron beam; an electrode having a hole through which the primary electron beam passes; a voltage control power supply configured to apply a negative voltage to the electrode; and a retarding voltage control power supply configured to generate an electric field, which decelerates the primary electron beam, on the sample by applying the negative voltage to the sample, wherein the charged particle beam device performs focus adjustment while an offset between the voltage applied to the electrode and the voltage applied to the sample is being kept constant.

4 Claims, 5 Drawing Sheets

(51) Int. Cl.
*H01J 37/21* (2006.01)
*H01J 37/28* (2006.01)
*H01J 37/10* (2006.01)
*H01J 37/147* (2006.01)

(52) U.S. Cl.
CPC ......... *H01J 37/28* (2013.01); *H01J 2237/0492* (2013.01); *H01J 2237/04756* (2013.01); *H01J 2237/063* (2013.01); *H01J 2237/10* (2013.01); *H01J 2237/15* (2013.01); *H01J 2237/21* (2013.01); *H01J 2237/244* (2013.01); *H01J 2237/2602* (2013.01); *H01J 2237/281* (2013.01)

(56) References Cited

U.S. PATENT DOCUMENTS

2003/0116709 A1  6/2003  Kazumori

2004/0036021 A1* 2/2004 Todokoro ............. H01J 37/026 250/310
2006/0006330 A1  1/2006  Seyama et al.
2006/0175548 A1* 8/2006 Kawasaki et al. ............. 250/310
2007/0235646 A1  10/2007 Tanii et al.
2008/0203298 A1* 8/2008 Ishijima ............... G01N 23/225 205/307
2013/0228701 A1* 9/2013 Fukuda ................. H01J 37/145 250/440.11

FOREIGN PATENT DOCUMENTS

| | | |
|---|---|---|
| JP | 2006-294627 A | 10/2006 |
| JP | 2007-194126 A | 8/2007 |
| JP | 4302316 B2 | 7/2009 |
| WO | WO 2004/061892 A1 | 7/2004 |

* cited by examiner

CHARGED PARTICLE BEAM DEVICE

TECHNICAL FIELD

The present invention relates to a charged particle beam device such as a sample inspection device, a review device, or a pattern measurement device using a charged particle beam.

BACKGROUND ART

A semiconductor device is manufactured by repeating a process in which a pattern formed on a photomask is transferred on a wafer by lithographic processing and etching processing. In such a manufacturing process, it is important to realize a high yield in an early stage and maintenance of stable operation of the manufacturing process. In order to realize them, it is essential to perform an in-line inspection of the wafer, analyze a found defect rapidly, and utilize it for investigation of a cause of a defect occurrence and a countermeasure against the defect occurrence. The automatic defect review technology and the classification technology will be the key to rapidly linking an inspection result with the countermeasure against the defect. In the automatic defect review technology, numerous defects detected are reviewed at high speed and in the classification technology, the defects are classified by occurrence causes. With the development of the miniaturization of the manufacturing process, a defect size, which affects the manufacturing yield of the semiconductor device, has also been miniaturized. As a result, it is difficult to perform a review with high resolution by an optical review device. Therefore, the review device of a scanning electron microscope (hereinafter sometimes abbreviated as a "review SEM") type capable of reviewing at high speed with high resolution has been made into products.

Position information of the defect on a semiconductor wafer is obtained from the optical defect inspection device, etc. In the review SEM, work to find a problem in the manufacturing process is performed by capturing an image with higher magnification than the optical defect inspection device. For example, stage movement to the position of the defect is performed at high speed. The position of the defect is detected in a low magnification image mode of the SEM, and a center of the defect is imaged in a high magnification image mode of the SEM. Then, a high magnification image obtained in this high magnification image mode is analyzed, and classification work of the defect is performed.

With the development of the semiconductor device, a space part of a line-and-space structure has been etched deeper, and a deep groove structure has been formed. An amount of signal electrons generated from the space part in electron beam irradiation has been decreased. Therefore, it has gradually become difficult to observe the space part compared with a line part since a signal-to-noise ratio reduces at the space part. In addition, a hole structure has also been etched deeper, and a deep hole structure is formed. Similarly, it has gradually become difficult to observe by the scanning electron microscope.

One of methods to improve the signal-to-noise ratio at the space part is the method in which a gain of a photomultiplier tube is increased. However, by this method, gradation of brightness in the line part within a same sample image increases simultaneously, and thus, it is impossible to observe the line part since the line part is too bright. Therefore, an energy filter is used to relatively increase the gradation of the space part by suppressing secondary electrons which cover the greater part of the signal electrons of the line part. The energy filter is a high-pass filter capable of selecting the signal electrons according to kinetic energy of the signal electrons.

As described in PTL 1, the following method has been known. In the method, the signal electrons are passed through a metal mesh on which a voltage has been applied, a retarding electric field is formed for the signal electrons, and the signal electrons are selected.

In addition, as described in PTL 2, the following method has been known. In the method, an electrode is arranged in an objective lens, the voltage is applied to the electrode, the retarding electric field is formed for the signal electrons, and the signal electrons passed through are selected.

CITATION LIST

Patent Literature

PTL 1: Japanese Patent No. 4,302,316 (U.S. Pat. No. 6,667,476)
PTL 2: JP 2006-294627 A (US2003/0042417)

SUMMARY OF INVENTION

Technical Problem

In the method described in PTL 1, the signal electrons are separated by arranging a conductive mesh on an optical axis and applying voltage. However, in this method, the number of the signal electrons capable of passing through the conductive mesh reduces due to limitation in an aperture ratio of the conductive mesh. Therefore, the sample image with the high signal-to-noise ratio cannot be obtained.

In addition, in the method described in PTL 2, the objective lens is provided with a function of the energy filter. However, it is necessary to arrange three electrodes, and the structure is complicated. If the number of electrodes is decreased to two, the two electrodes are exclusively used for the energy filter, and the electrode cannot be used for focus adjustment. Therefore, using a change in magnetic field of the objective lens is the only way for focus adjustment. However, since responsiveness of the change in magnetic field is poor, throughput of the review SEM reduces.

An object of the present invention is to provide a charged particle beam device having a configuration suitable for observing the signal-to-noise ratio of the deep groove or the deep hole of the semiconductor device at high throughput.

Solution to Problem

In order to solve the above problem, for example, the configuration described in the claims is employed.

A plurality of means to solve the above problem is included herein, and an example thereof includes:

an electron source configured to generate a primary electron beam;

an objective lens configured to focus the primary electron beam;

a deflector configured to deflect the primary electron beam;

a detector configured to detect a secondary electron or a reflection electron generated from a sample by irradiation of the primary electron beam;

an electrode having a hole through which the primary electron beam passes;

a voltage control power supply configured to apply a negative voltage to the electrode; and a retarding voltage control power supply configured to generate an electric field, which decelerates the primary electron beam, on the sample by applying the negative voltage to the sample, wherein focus adjustment is performed while an offset between the voltage applied to the electrode and the voltage applied to the sample is being kept constant.

Advantageous Effects of Drawings

According to the present invention, it is possible to observe the signal-to-noise ratio of the deep groove or the deep hole of the semiconductor device at high throughput.

Problems, configurations, and effects other than those described above will be clarified by the description of the following embodiment.

DESCRIPTION OF EMBODIMENTS

Hereinafter, an embodiment of the present invention will be described with reference to the drawings. Hereinafter, the example using a scanning electron microscope will be described as an example of a charged particle beam device. However, this is merely an example of the present invention, and the present invention is not limited to the embodiment described below. In the present invention, the charged particle beam device widely includes a device which captures an image of a sample using a charged particle beam. An example of the charged particle beam device includes an inspection device, a review device, or a pattern measurement device using the scanning electron microscope. In addition, the present invention can also be applied to a general-purpose scanning electron microscope, and a sample processing device or a sample analysis device including a scanning electron microscope.

A "defect" herein is not limited to a pattern defect, and widely includes a foreign substance, an abnormality in pattern dimension, and a structural defect.

Figure 1:
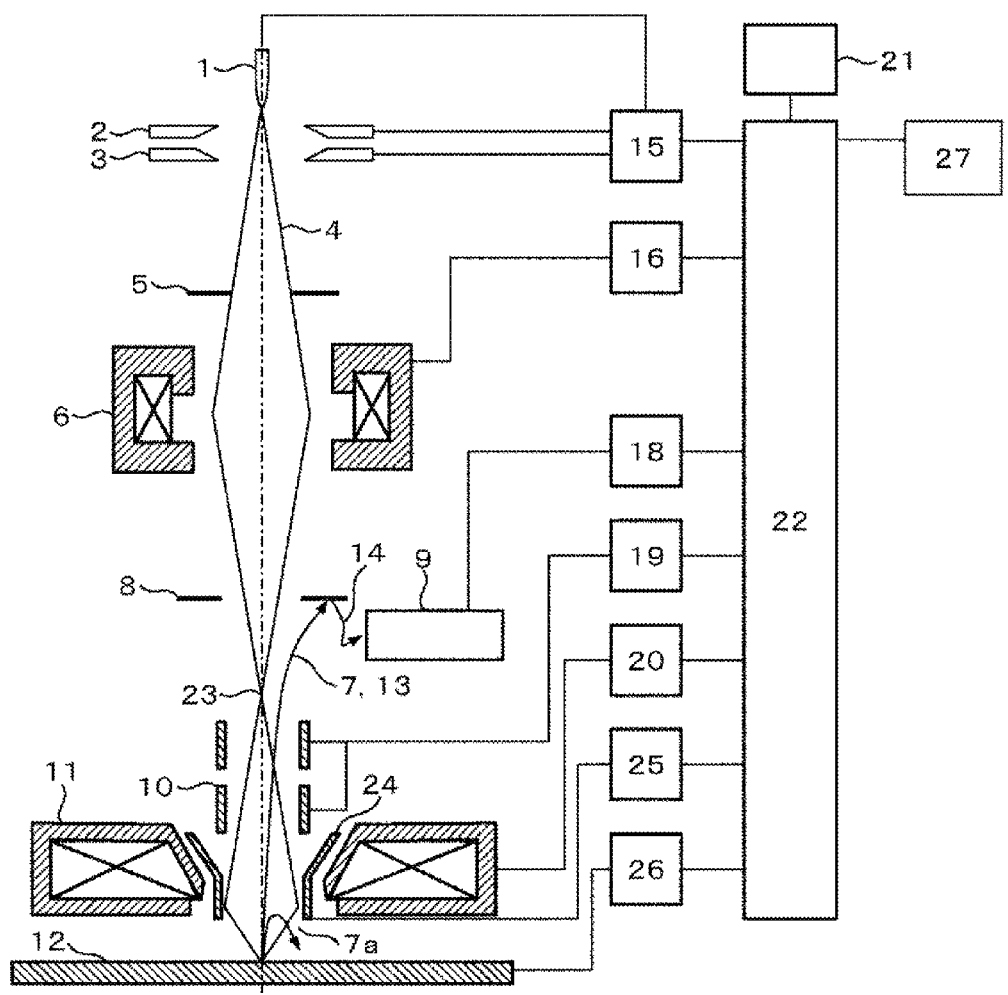
FIG. 1 is a longitudinal sectional view illustrating a schematic structure of a charged particle beam device according to the present embodiment.

In FIG. 2 and the subsequent figures, the same numbers as those in FIG. 1 are given to the same function parts as those in FIG. 1, and redundant descriptions thereabout are omitted. FIG. 1 is a schematic sectional view illustrating an example of the scanning electron microscope according to the present embodiment. In the figure, a vacuum container, a wafer carriage system, etc. necessary for the scanning electron microscope have been omitted. A voltage is applied between a cathode 1 and a first anode 2 by a high-voltage control power supply 15 controlled by a control device 22, and predetermined emission current is drawn from the cathode 1. Since an acceleration voltage is applied between the cathode 1 and a second anode 3 by the high-voltage control power supply 15 controlled by the control device 22, a primary electron beam 4 emitted from the cathode 1 is accelerated and directed to a subsequent stage of a lens system. An unnecessary region of the primary electron beam 4 is removed by a diaphragm plate 5. Then, the primary electron beam 4 is focused on an image forming position 23 by a focusing lens 6 controlled by a focusing lens control power supply 16.

Thereafter, the primary electron beam 4 is focused on a sample 12 as a micro spot by an objective lens 11 controlled by an objective lens control power supply 20. Then, the primary electron beam 4 is deflected by a deflection coil 10 controlled by a deflection coil control power supply 19 and scans the sample 12 two-dimensionally. A scanning signal of the deflection coil 10 is controlled by the deflection coil control power supply 19 according to observation magnification. A scanning range of the primary electron beam 4 is determined by the observation magnification. By applying a negative voltage to the sample 12 or a sample holding container (not shown) which holds the sample 12 by a retarding voltage control power supply 26, an electric field which decelerates the primary electron beam 4 is generated. As a result, the primary electron beam 4 passes through the objective lens 11 while having kinetic energy of the acceleration voltage or more. Then, the primary electron beam 4 is decelerated after passing through the objective lens 11, and collides against the sample 12 with the kinetic energy of the acceleration voltage. Since the primary electron beam 4 can pass through the objective lens 11 with higher kinetic energy, aberration can be reduced, thereby enhancing resolution. Of course, an optical system of the scanning electron microscope may include other lens, electrode, or detector other than this, and a part may differ from the above. A configuration of a charged particle optical system is not limited thereto.

A signal electron generated from the sample 12 by irradiation of the primary electron beam 4 is classified into a secondary electron 7 and a reflection electron 13 according to the kinetic energy. The secondary electron 7 is accelerated in the direction of a conductor plate 8 by the voltage applied to the sample 12, and passes through the objective lens. The secondary electron 7 has kinetic energy (for example, when the voltage applied to the sample 12 is −100 V, −100 eV to −120 eV) close to the voltage applied to the sample 12. The reflection electron 13 has kinetic energy (for example, when the kinetic energy of the primary electron beam 4 is 1 keV, −800 eV to −1000 eV) close to the primary electron beam 4. After traveling toward the cathode 1 from the objective lens 11, the secondary electron 7 or the reflection electron 13 generates a third electron 14 by colliding against the conductor plate 8 having an opening through which the primary electron beam 4 can pass. The third electron 14 is detected by a detector 9, amplified by a signal amplifier 18, and displayed on an image display device 21 as a sample image by synchronizing it with the scanning signal of the deflection coil 10.

In addition, the scanning electron microscope includes a control part and an image generating part (illustration omitted). The control part controls operation of each part, and the image generating part generates the image based on a signal output by the detector. The control part or the image generating part may be configured as hardware by a dedicated circuit board, or may be configured as software to be executed by a computer connected to the scanning electron microscope. When the control part or the image generating part is configured by hardware, it is realized by integrating a plurality of arithmetic units which execute processing, on a wiring board, or within a semiconductor chip or a package. When the control part or the image generating part is configured by software, it is realized by executing a program executing desired arithmetic processing with a high-speed general-purpose CPU mounted on the computer. An existing device can be upgraded by a recording medium in which this program has been recorded. The device, the circuit, and the computer are connected by a wired or wireless network, and data is appropriately transmitted and received therebetween. Hereinafter, description is made under an assumption that various arithmetic processing is performed by the control device 22, and various programs or data are retained in a storage part 27, unless otherwise noted.

Here, a negative voltage is applied to an electrode 24 arranged in the objective lens 11 by a voltage control power supply 25. The electrode 24 is cylindrically shaped to surround an optical axis of the primary electron beam, and is arranged so that the primary electron beam passes through a cylindrical hole in a magnetic path of the objective lens. A voltage offset Vd is defined by the following formula. (voltage offset Vd)=(voltage of electrode 24)−(voltage of sample 12). The voltage offset Vd becomes negative by setting an absolute value of the voltage of the electrode 24 greater than an absolute value of the voltage of the sample 12. By making the voltage offset Vd a negative voltage, the secondary electron 7 generated from the sample is decelerated. The secondary electron 7 cannot fly in the direction of the conductor plate 8, and takes a locus as 7a. As a result, the secondary electron 7 cannot reach the conductor plate 8, and the secondary electron 7 is suppressed and the reflection electron 13 becomes predominant in the sample image. By adjusting the negative voltage of the voltage offset Vd, the secondary electron 7 with the kinetic energy of a certain amount or below is suppressed, and the sample image having a relatively increased rate of the reflection electron 13 is configured. The electrode 24 may be formed as a part of the magnetic path of the objective lens 11, and may be shared with the magnetic path of the objective lens 11.

Figure 2A:
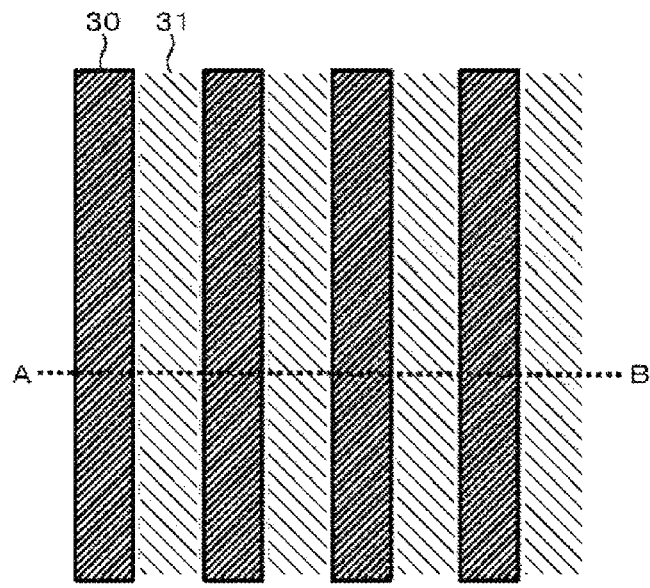
FIG. 2a is a schematic diagram of a line-and-space structure as a kind of a semiconductor pattern structure.
Figure 2B:
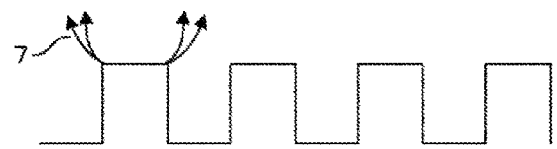
FIG. 2b is a schematic diagram of a cross section of the line-and-space structure.

FIG. 2a is a schematic diagram illustrating a line-and-space structure as a kind of a semiconductor pattern structure formed on a wafer. FIG. 2b is a schematic diagram of a cross section in the A-B direction in FIG. 2a. In the line-and-space structure, a line part 31 has a protruded shape, and a space part 30 has a recessed shape. When the line part 31 having the protruded shape is irradiated with the primary electron beam 4, the secondary electrons 7 are effectively emitted from the edge parts at both ends of the line part 31 by an edge effect. On the other hand, when the space part 30 having the recessed shape is irradiated with the primary electron beam 4, the secondary electrons 7 are less likely to be emitted than from the line part 31, since there is no edge shape as those at both ends of the line part 31. As a result, the line part 31 becomes bright and the space part 30 becomes dark relatively in the sample image. In a case where there is a shape defective part caused by a semiconductor process in the space part 30, this shape defective part cannot be detected. A gradation width of brightness of the sample image (SEM image) is fixed. If gradation values of the brightest part and the darkest part of the image exist in one image, adjustment to lower the gradation value of the entire image is performed, so that the gradation value of a bright part becomes the gradation width or lower. Therefore, the gradation value of the dark part becomes darker. Specifically, it is not possible to detect the shape defective part when the gradation of the line part 31 is 200 or higher and the gradation of the space part 30 is 50 or lower, in a case where the gradation of brightness of the sample image has 256 stages.

Figure 3:
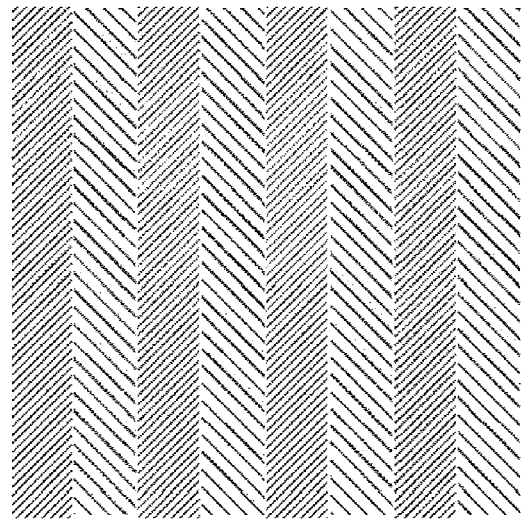
FIG. 3 is a schematic diagram of a sample image when a voltage offset Vd is made a negative voltage.

The secondary electron 7, which is generated when the line part 31 is scanned with the primary electron beam 4, is prevented from reaching the conductor plate 8. In this case, a frequency of the conversion to the third electron 14 and detection thereof performed by the detector 9 decreases. As a result, the gradation value of brightness of the line part 31 relatively decreases compared with the space part. Here, the voltages of the electrode 24 and the sample 12 are adjusted so that the above-described voltage offset Vd becomes the negative voltage. As a result, only the secondary electron 7 can be selectively suppressed and detected, and the line part can be made relatively bright compared with the space part. FIG. 3 is a schematic diagram illustrating the sample image when the voltage offset Vd is made the negative voltage. For example, when the gradation of the line part 31 is 100 and the gradation of the space part 30 is 70, the shape defective part of the space part 30 can be detected. As an example other than the line-and-space structure, since a hole bottom part of a hole structure is relatively dark compared with a peripheral part, the hole bottom part can be made relatively bright by making the voltage offset Vd the negative voltage. The same is applied to other sample structures.

Figure 4:
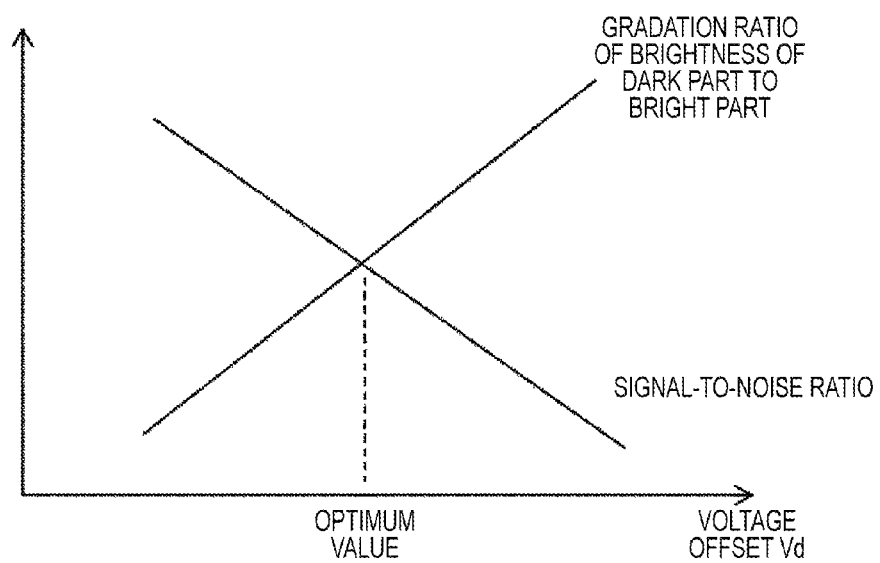
FIG. 4 is a diagram illustrating dependency of a gradation ratio of brightness of a dark part to a bright part, and of a signal-to-noise ratio, on the voltage offset Vd.
Figure 5:
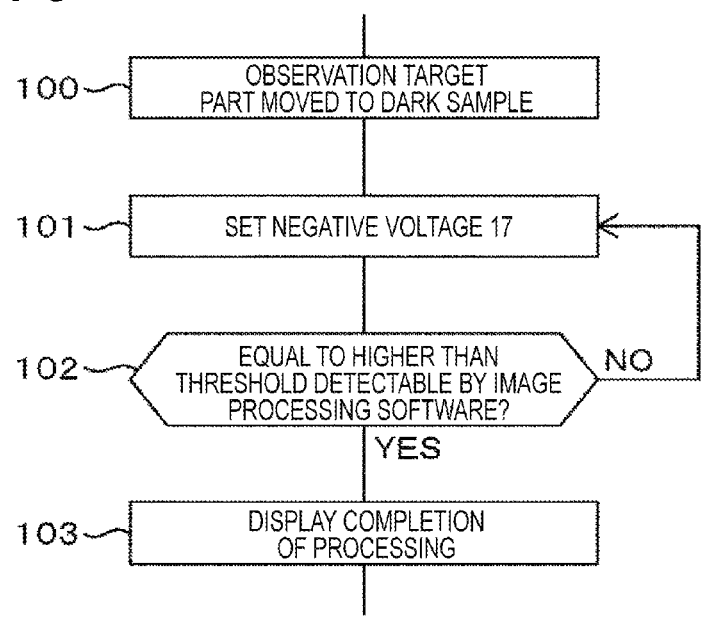
FIG. 5 is a sequence diagram for obtaining an optimum value of the voltage offset Vd.

The voltage offset Vd has an optimum value based on the line-and-space structure, the hole structure, the shape of a structural defect of a dark part and so on. By setting the voltage offset Vd, the detection of the secondary electron 7, which has energy equal or below the kinetic energy obtained by adding the voltage offset Vd and the voltages of the sample 12, can be suppressed. FIG. 4 shows dependency of a gradation ratio of brightness of the dark part of the space part 30 to the bright part of the line part 31, and of a signal-to-noise ratio, on the voltage offset Vd. The gradation ratio of brightness of a dark part to a bright part increases in proportion to the voltage offset Vd. However, the secondary electron 7 as a main component of the signal electron, which forms the sample image, is suppressed by the increase in the voltage offset Vd. As a result, the signal-to-noise ratio of the sample image reduces. Therefore, the optimum value of the voltage offset Vd is determined by a sequence shown in FIG. 5.

A visual field is moved by stage movement or the like to an observation target part of the sample such as the line-and-space structure and the hole structure (Step 100). The voltage offset Vd is determined and the voltages of the electrode 24 and the sample 12 are set (Step 101). As an initial value, the voltage offset Vd is 0 V. It is determined whether the structural defect in the dark part is detectable by structural defect detecting software (Step 102). This structural defect detecting program determines based on the above gradation ratio of brightness of the dark part to the bright part, and the signal-to-noise ratio. When the determination is "NO", the flow returns to Step 101, and the voltage offset Vd is changed only by a predetermined voltage and made the negative voltage (Step 101). For example, −1 V is set. By repeating this, the voltage offset Vd, in which the determination becomes "OK", is determined and completion of processing is displayed (Step 103).

Defect groups on a semiconductor wafer are distributed discretely on the wafer. When these defect groups are observed, an observation position on the wafer changes for each defect. When the observation position on the wafer changes, the height of the wafer changes by mechanical tolerance of the device or the change in thickness of the wafer. Therefore, a function of adjusting a focus position of the primary electron beam 4 according to the height of the wafer, is required. Moreover, it is required to shorten the time of observing the defect on the semiconductor wafer as much as possible for improving productivity of semiconductor products, that is, high throughput is required. Therefore, it is also required to perform focus adjustment in as short a time as possible.

As a method which has conventionally been used well to adjust a focus, there is a method to adjust the focus by changing a magnetic field of the objective lens 11, thereby changing a focal distance of the objective lens 11. However, response speed of a change in magnetic field is, for example, on the order of several seconds, and is extremely slow by the influence of an eddy current.

As a method to adjust the focus at high speed, there is a method to change the focal distance of the objective lens 11 by changing an electric field in a space of the objective lens 11. A response time of a change in electric field is determined by the time in which voltage of the electrode 24 or the sample 12 is changed. That is, the response time is determined by the response speed of the voltage control power supply 25 or the retarding voltage control power supply 26, and is extremely high-speed. The voltage control power supply 25 and the retarding voltage control power supply 26 respectively supply the voltages to the electrode 24 and the sample 12. The response time by the change in electric field is, for example, on the order of several tens of microseconds. Therefore, the focus is adjusted at high speed by changing the focal distance by the change in the voltage of the electrode 24. However, in the voltage of the focused electrode 24, the voltage of the sample 12 is constant. Therefore, the voltage offset Vd between the voltage of the electrode 24 and the voltage of the sample 12 is not the optimum value, thus the structural defect of the dark part may not be detected.

Alternatively, the focus is adjusted at high speed by changing the focal distance by the change in the voltage of the sample 12. However, in the voltage of the focused sample 12, the voltage of the electrode 24 is constant. Therefore, the voltage offset Vd between the voltage of the electrode 24 and the voltage of the sample 12 is not the optimum value, thus the structural defect of the dark part may not be detected.

Therefore, the following method is used to adjust the focus at high speed. It is a method in which the focal distance is changed by changing the voltages of the electrode 24 and the sample 12 by equal voltage in a same polarity in a state where the voltage offset Vd is being kept at the optimum value. As a result, the focal distance can be adjusted while keeping the voltage offset between the voltage of the electrode 24 and the voltage of the sample 12 constant. For example, when the optimum value of the voltage offset Vd is −5 V, the voltage of the electrode 24 is −105 V, and the voltage of the sample 12 is −100 V, the voltage of the electrode 24 is set to −95 V and the voltage of the sample 12 is set to −90 V while the optimum value is kept at −5 V, for focus adjustment. The primary electron beam 4 is further accelerated in the space of the objective lens 11 by the increase in the voltage of the electrode 24. Since the magnetic field of the objective lens 11 is constant, the focal distance of the primary electron beam 4 extends and the primary electron beam 4 focuses in the inside sample direction (over-focus). By increasing the voltage of the sample 12 at the same time, the primary electron beam 4 is less likely to be decelerated directly on the sample 12. Therefore, the focal distance of the primary electron beam 4 extends and the primary electron beam 4 focuses in the inside sample direction (over-focus). In either case, when the voltage is increased, a focal point moves in the direction where the focal distance of the primary electron beam 4 extends, that is, in the direction where the primary electron beam 4 focuses (over-focus) in the inside sample direction. Therefore, by increasing the voltages of the electrode 4 and the sample 12 by equal amount under a certain voltage offset Vd, the focal distance of the primary electron beam 4 extends. As a result, the focus position can be moved to the over-focus side, and used for focus adjustment.

The primary electron beam 4 is decelerated at the electrode 24 and is made incident to the objective lens. For this purpose, the electrode 24 is arranged in the direction closer to the cathode 1 than a lens principal surface of the objective lens 11, and within a range in which the electric field of the electrode 24 is able to reach the principal surface of the objective lens 11.

Of course, the focus position can be moved to the under-focus side by decreasing the voltages of the electrode 24 and the sample 12 by equal amount in the same polarity, while the voltage offset Vd is being kept at the optimum value. In this case also, focal movement by the increase in the voltages of the electrode 24 and the sample 12 is made in the same direction.

Thus, by changing the voltages of the electrode 24 and the sample 12 by the same amount in the same polarity direction while the voltage offset Vd is being kept at the optimum value, the focal distance of the primary electron beam 4 is changed, and the focus position can be changed.

Thus, it is possible to perform focus adjustment at high speed by changing the voltages of the electrode 24 and the sample 12. Moreover, it is possible to realize a function of inspecting the structural defect of the dark part by suppressing the secondary electron 7.

In addition, the focal distance increases/decreases in the same polarity in response to the change in voltages of the electrode 24 and the sample 12. Therefore, variation amount of the focal distance per unit voltage is highly sensitive, i.e., twice or more the conventional method in which only one of the voltages of the electrode 24 and the sample 12 is changed to focus. As a result, it is possible to cope with variation in height of the wafer of twice or more the conventional method.

A center of an electrostatic lens formed at the electrode 24 does not coincide with a center of an electrostatic lens formed at the sample 12, due to a mechanical error of a component or the like, which holds the electrode 24 and the sample 12. Even if the primary electron beam 4 is adjusted so that it passes through the center of the electrostatic lens of the electrode 24, the primary electron beam 4 passes through outside of an axis of the electrostatic lens of the sample 12. Therefore, movement of the visual field by the change in the voltage of the electrode 24 in focus adjustment does not occur. However, a position of the visual field of the sample image varies due to the change in the voltage of the sample 12. Therefore, the structural defect of an observation target is outside the visual field, and may not be observed. On the contrary, even if the primary electron beam 4 is adjusted so that it passes through the center of the electrostatic lens of the sample 12, the position of the visual field of the sample image varies due to the change in the voltage of the electrode 24. Therefore, the position of the visual field is corrected by applying an offset current to a deflecting current of the deflection coil 10 according to an applied voltage of the sample 12 or the electrode 24. Alternatively, the position of the visual field is corrected by using an electric visual field movement coil. In this case also, a current value is set according to the applied voltage of the sample 12 or the electrode 24. The electric visual field movement coil, not shown in the figure, adds an offset over a scanning range of the primary electron beam by applying current and can move entirely over the scanning range. The electric visual field movement coil has been known as an image shift coil as described in JP 10-097836 A. A visual field correction amount is preliminarily obtained as a preset value and stored in the control device 22. The visual filed correction amount is used for correcting the position of the visual field in association with the applied voltage of the sample 12.

The adjustment of a detection condition and the focus for the structural defect of the dark part is performed by a structural defect detecting and focus adjusting program.

Figure 6:
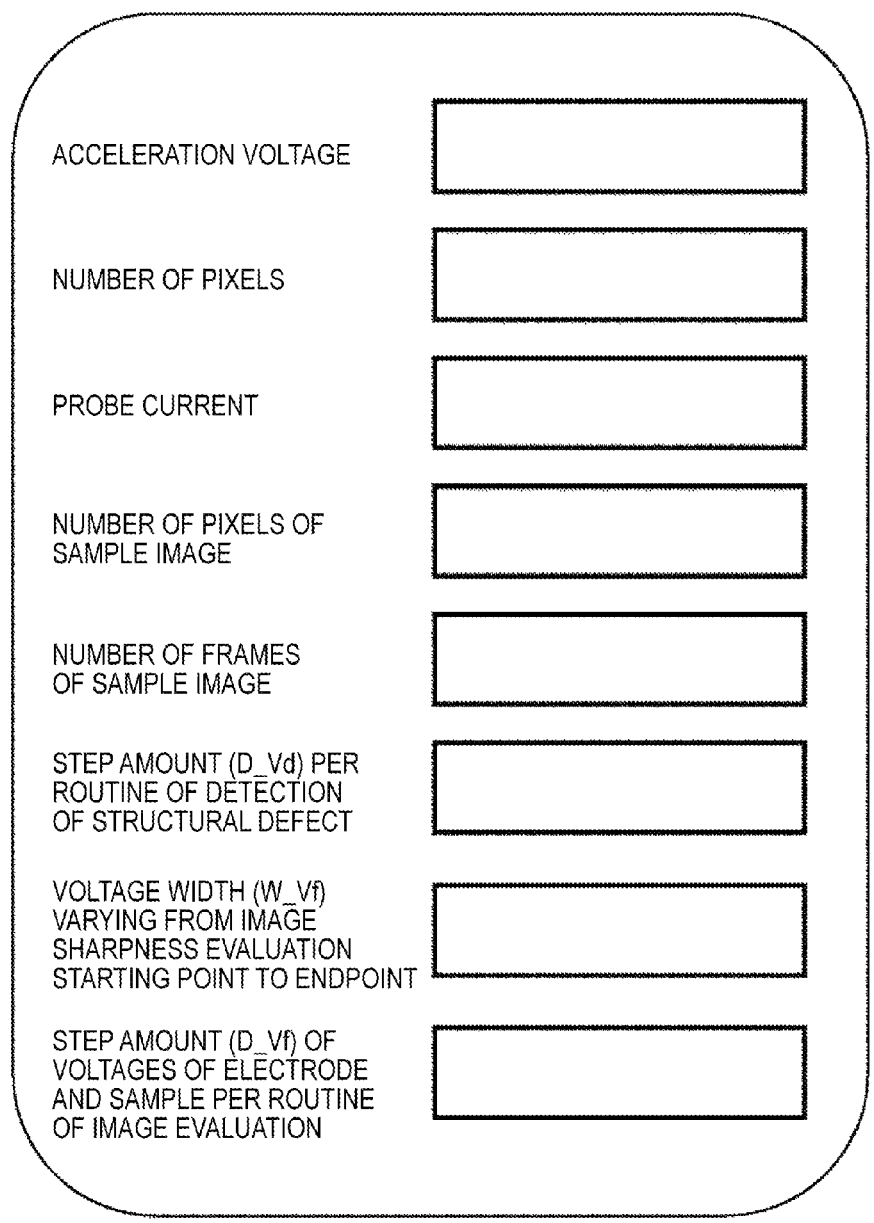
FIG. 6 is a diagram illustrating an example of a parameter setting screen in detection of a structural defect and focus adjustment.

FIG. 6 shows a parameter setting screen in the structural defect detecting program and the focus adjusting program. In this screen, the following can be set: the acceleration voltage when the sample image is obtained; a probe current; the number of pixels of the sample image; the number of frames of the sample image; a step amount (D_Vd) of the voltage offset Vd per routine of detection of the structural defect in the structural defect detecting program; a voltage width (oscillation width W_Vf) varying from an image sharpness evaluation starting point to an endpoint in the focus adjusting program; and a step amount (D_Vf) of the voltages of the electrode 24 and the sample 12 per routine of image evaluation in the focus adjusting program.

Here, as the step amount (D_Vd) of the voltage offset Vd per routine is set to be smaller, an optimum condition, in which the structural defect of the dark part can be detected, can be obtained with higher precision. The voltage width (oscillation width W_Vf) varying from the image sharpness evaluation starting point to the endpoint is set to be large when the variation in height of the wafer is large. As the step amount (D_Vf) of the voltages of the electrode 24 and the sample 12 per routine is set to be smaller, the sharpness of the sample image can be evaluated in detail, and the focus position can be adjusted with higher precision.

Figure 7:
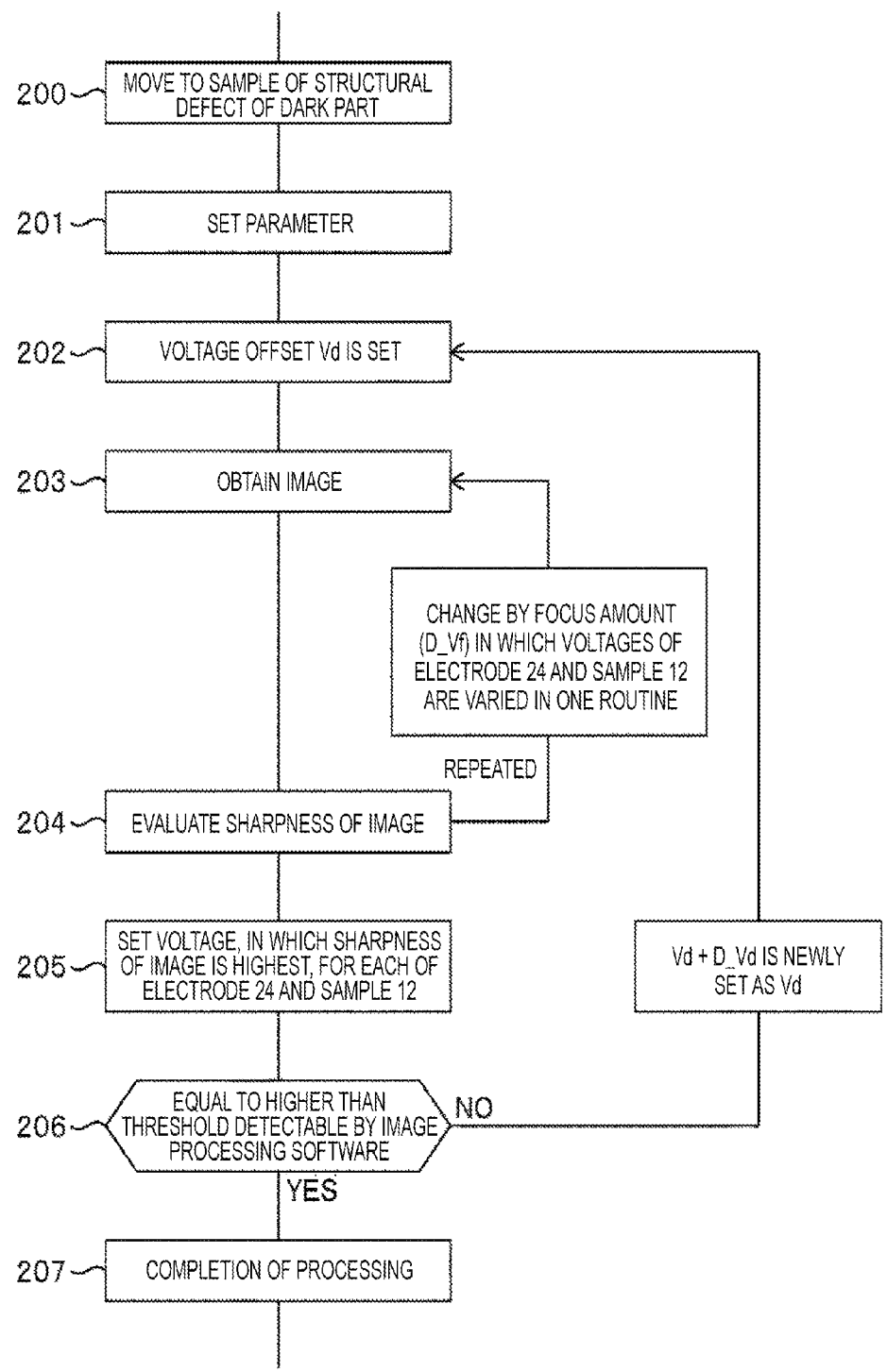
FIG. 7 is a sequence diagram of detection of the structural defect and the focus adjustment.

FIG. 7 shows a sequence of the structural defect detecting program and the focus adjusting program. This sequence is performed by the control device 22.

First, the visual field is moved to a sample position where there is the structural defect of the dark part by stage movement or the like (Step 200). Each parameter is set at the screen in FIG. 6 (Step 201). Next, the voltage offset Vd that has been set in FIG. 6 is set by the program (Step 202). The initial value of the voltage offset Vd is desirably set to be 0 V. Next, the sample image is obtained by changing the voltages of the electrode 24 and the sample 12 only by the step amount (D_Vf) of the voltages of the electrode 24 and the sample 12 per routine of the image evaluation, while fixing the voltage offset Vd (Step 203). The sharpness of the sample image obtained in Step 203 is evaluated by the structural defect detecting program (Step 204). Steps 203 and 204 are repeated the number of times obtained by dividing the voltage (oscillation width W_Vf) varying from the image sharpness evaluation starting point to the endpoint in the focus adjusting program, by the step amount (D_Vf) of the voltages of the electrode 24 and the sample 12 varied in one routine. The voltage, in which the sharpness of the image is the highest, for each of the electrode 24 and the sample 12 is set (Step 205). It is determined whether the structural defect in the dark part can be detected from the sample image at this time by the structural defect detecting program (Step 206). This structural defect detecting program determines based on the above gradation ratio of brightness of the dark part to the bright part, and the signal-to-noise ratio. When the determination is "NO", the flow returns to Step 202, and the voltage offset Vd is changed by the step amount (D_Vd) of the voltage offset Vd per routine of detection of the structural defect. By repeating this, the voltage offset Vd, in which the determination in Step 206 becomes "YES", is obtained. Then the processing is completed (Step 207). The completion of the processing may be displayed on a display device.

Another method of focus adjustment will be shown. A height measurement sensor (not shown) capable of measuring the height of the wafer is prepared. A relationship between the height of the wafer measured by the height measurement sensor and the voltage applied to the electrode 24 and the sample 12 at the voltage offset Vd preliminarily set by a user, is obtained. In the storage part 27 connected to the control device 22, the voltage of the electrode 24 is recorded as a preset value for each combination of the voltage offset Vd and the height of the wafer. The voltage applied to the sample 12 is obtained by the voltage offset Vd and the voltage of the electrode 24. The height of the wafer of the structural defect of the dark part is measured by the height measurement sensor. It is a method in which the voltages are set for the electrode 24 and the sample 12 when the voltage offset Vd is the optimum value, and focus is set on the sample on the wafer, based on the preset value recorded in the storage part 27. In this method, the sequence as described in FIG. 7 is not performed each time the position of the wafer is moved. Since the focus adjustment can be performed only by setting the preset value recorded in the control device 22, the focus adjustment can be performed at higher speed than the method in FIG. 7.

The present invention is not limited to the above-described embodiment, and various modifications are included. For example, the above-described embodiment has been described in detail so that the present invention is easily understood, and not limited to the one necessarily including all configurations described. Apart of the configuration of an embodiment can be replaced with the configuration of other embodiments, and the configuration of other embodiments can be added to the configuration of an embodiment. In addition, other configurations can be added to, deleted from, or replaced with the part of the configuration of each embodiment. In addition, a part or all of each configuration, function, processing part, processing means, etc. described above may be realized by hardware, for example, by designing an integrated circuit. In addition, each configuration, function, etc. described above may be realized by software in which a processor interprets and executes a program that realizes each function.

Information on the program, a table, a file, etc. which realize each function can be placed in a recording device such as a memory, a hard disk, or a solid state drive (SSD), or in a recording medium such as an IC card, an SD card, or a DVD. A control line or an information line considered to be necessary for explanation is indicated, and all the control lines or the information lines in the product are not necessarily indicated. Actually, it could be considered that almost all configurations are mutually connected.

REFERENCE SINGS LIST 1 cathode
2 first anode
3 second anode
4 primary electron beam
5 diaphragm plate
6 focusing lens
7, 7a secondary electron
8 conductor plate
9 detector
10 deflection coil
11 objective lens
12 sample 13 reflection electron
14 third electron
15 high-voltage control power supply
16 focusing lens control power supply
18 signal amplifier
19 deflection coil control power supply
20 objective lens control power supply
21 image display device
22 control device
23 image forming position
24 electrode
25 voltage control power supply
26 retarding voltage control power supply
27 storage part
30 space part
31 line part

The invention claimed is:

1. A charged particle beam device comprising:
   an electron source configured to generate a primary electron beam;
   an objective lens configured to focus the primary electron beam;
   a deflector configured to deflect the primary electron beam;
   a detector configured to detect a secondary electron or a reflection electron generated from a sample by irradiation of the primary electron beam;
   an electrode having a hole through which the primary electron beam passes;
   a voltage control power supply configured to apply a first negative voltage to the electrode; and
   a retarding voltage control power supply configured to generate an electric field, which decelerates the primary electron beam, on the sample by applying a second negative voltage to the sample,
   wherein the charged particle beam device performs focus adjustment by changing the first negative voltage applied to the electrode and the second negative voltage applied to the sample while maintaining a difference between the first and second negative voltages.

2. The charged particle beam device according to claim 1, wherein an offset current according to the second negative voltage applied to the sample is added to a current which flows in the deflector.

3. The charged particle beam device according to claim 1, further comprising:
   an electric visual field movement coil configured to move a scanning range of the primary electron beam by applying a predetermined current,
   wherein a value of a current flowing in the electric visual field movement coil is set according to the second negative voltage applied to the sample.

4. The charged particle beam device according to claim 1, further comprising:
   a height measurement sensor configured to measure a height of the sample; and
   a storage part configured to store the first negative voltage applied to the electrode for each combination of the offset and the height of the sample,
   wherein the first negative voltage applied to the electrode read by the storage part and the second negative voltage applied to the sample, which is determined by the first negative voltage applied to the electrode and the offset, are set based on the height of the sample measured by the height measurement sensor and the offset preliminarily set.

* * * * *